United States Patent [19]

Hori et al.

[11] Patent Number: 5,188,706
[45] Date of Patent: Feb. 23, 1993

[54] METHOD OF MANUFACTURING AN X-RAY EXPOSURE MASK AND DEVICE FOR CONTROLLING THE INTERNAL STRESS OF THIN FILMS

[75] Inventors: Masaru Hori; Masamitsu Itoh, both of Yokohama, Japan

[73] Assignee: Kabushiki Kaisha Toshiba, Kawasaki, Japan

[21] Appl. No.: 494,397

[22] Filed: Mar. 16, 1990

[30] Foreign Application Priority Data

Mar. 18, 1989 [JP] Japan .................................. 1-67092
Nov. 22, 1989 [JP] Japan .................................. 1-304192

[51] Int. Cl.$^5$ .............................................. G03F 9/00
[52] U.S. Cl. ................................ 156/643; 156/646; 156/656; 156/657; 156/659.1; 430/5; 378/35
[58] Field of Search .................... 437/11, 13; 430/5; 378/35; 156/656, 659.1, 657, 643, 646

[56] References Cited

U.S. PATENT DOCUMENTS

| | | | |
|---|---|---|---|
| 4,093,503 | 6/1978 | Harris et al. | 156/678 |
| 4,515,876 | 5/1985 | Yoshihara et al. | 378/35 X |
| 4,842,676 | 6/1989 | Jucha et al. | 156/656 X |
| 4,915,746 | 4/1990 | Welsch | 427/38 X |
| 4,946,751 | 8/1990 | Bruns et al. | 378/35 X |
| 5,005,075 | 4/1991 | Kobayashi et al. | 378/35 |

FOREIGN PATENT DOCUMENTS 63-76325 4/1988 Japan .

OTHER PUBLICATIONS

J. Vac. Sci. Technol. B6(6), Nov./Dec. 1988; pp. 2174-2177.
Microelectronic Engineering, vol. 5, 1986, pp. 51-59, I. Plotnik, et al., "Ion-Implant Compensation of Tensile Stress in Tungsten Absorber for Low Distortion X-Ray Masks".
Journal of Vacuum Science & Technology; Part B, vol. 6, No. 1, Jan./Feb. 1988, pp. 174-177, Toshihiko Kanayama, et al., "Reduction in X-Ray Mask Distortion Using Amorphous $WN_x$ Absorber Stress Compensated with Ion Bombardment".
Patent Abstracts of Japan, vol. 10, No. 272 (E-437) [2328], Sep. 16, 1986, & JP-A-61-095573, May 14, 1986, Todatoshi Nozaki, "Formation of Gate Electrode Thin Film".
Patent Abstracts of Japan, vol. 12, No. 335 (E-656) [3182], Sep. 9, 1988, & JP-A-63-098124, Apr. 28, 1988, Shuichi Yamamoto, "Manufacture of Semicondutor Device".
Solid State Technology, vol. 30, No. 9, Sep. 1987, pp. 151-156, Marcos Karnezos, "X-Ray Mask Distortions".

*Primary Examiner*—Thi Dang
*Attorney, Agent, or Firm*—Oblon, Spivak, McClelland, Maier & Neustadt

[57] ABSTRACT

An X-ray mask can be manufactured by forming an X-ray transmitting thin film on a mask support, forming an X-ray absorber thin film on the X-ray transmitting thin film, and patterning the X-ray absorber thin film with a desired pattern to form an X-ray absorber pattern. Prior to the patterning, at least one inert element with an atomic number greater than that of neon is ion-implanted in the X-ray absorber thin film.

17 Claims, 12 Drawing Sheets

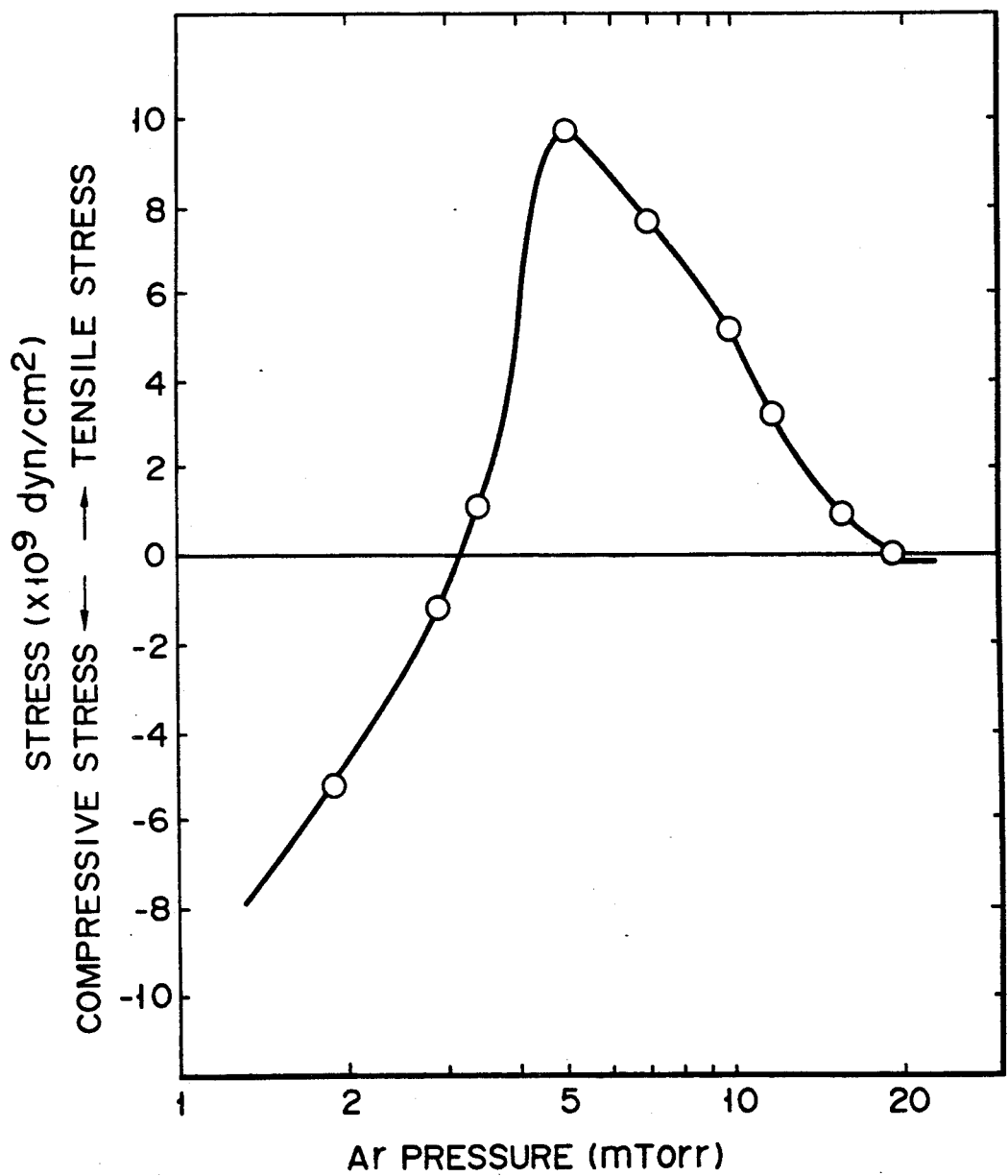
F I G. 3

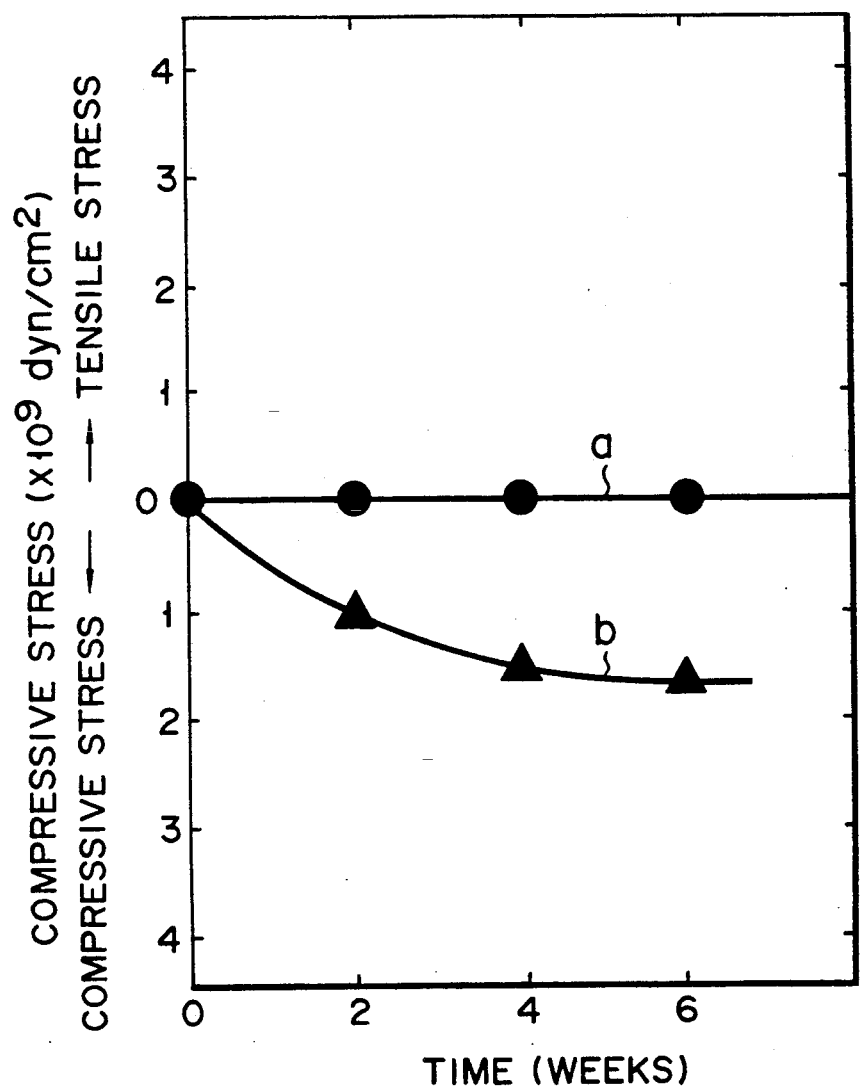
F I G. 7

METHOD OF MANUFACTURING AN X-RAY EXPOSURE MASK AND DEVICE FOR CONTROLLING THE INTERNAL STRESS OF THIN FILMS

BACKGROUND OF THE INVENTION

1. Field of the Invention

This invention concerns a method of manufacturing an X-ray exposure mask (referred to hereafter as an X-ray mask), a device for controlling the internal stress of thin films, and in particular, the improvement of X-ray absorption thin film patterns.

2. Description of the Related Art

In recent years, there has been a strong demand for higher density of semiconductor integrated circuits and high integration, and with regard to precision processing of circuit patterns, rapid growth is taking place in the research and development of lithographic techniques to form patterns on photosensitive materials.

At present, photolithography which uses light as the exposure medium is the most widely employed but a limit to the resolving power that is possible with this technique is now being reached. In place of photolithography, therefore, intensive research is being carried out on X-ray lithography which in principle can offer drastic improvements in resolution.

In X-ray lithography, unlike the exposure method used with light, no technique has yet been devised to reduce any specified pattern in size before it is transferred. In X-ray lithography, therefore, an X-ray exposure mask with the specified pattern and the sample are held parallel at an interval of about 10 μm apart, and the pattern is transferred to the surface to be exposed by irradiating it with X-rays through this mask with a 1:1 correspondence.

In this 1:1 transfer arrangement, the dimensional and positional precision of the pattern on the X-ray mask becomes the precision of the device, hence it is required that the dimensional and positional precision of the pattern on the mask is of the order of 1/10 of the minimum line width of the device. Further, as SOR (synchrotron orbital radiation) light is usually preferred as the X-ray source, the mask structure must be capable of withstanding strong X-ray radiation without sustaining damage. Moreover, with the narrowing of line widths from 0.5 μm to the 0.1 μm of the next generation of devices, the vertical/horizontal ratio in a section through a pattern on the mask is increasing, and this may be expected to lead to various structural problems.

The major requisite for the improvement of X-ray lithography at this time is thus the development of better structures for X-ray masks and of methods of manufacturing them.

X-ray masks usually have the following structure. A thin film of X-ray transmitting material, which has a very low absorption coefficient for X-rays, is formed on a ring-shaped mask support, and a mask pattern (X-ray absorber pattern) is formed from a material with a high X-ray absorptivity coefficient on this X-ray transmitting film. In this structure, the mask support is used to provide reinforcement for the X-ray transmitting film which is mechanically very weak owing to its very small thickness.

This X-ray exposure mask has been manufactured by the following method.

Firstly, a SiC film of thickness 2.7 μm is formed on the front surface of a Si substrate by LPCVD at a substrate temperature of 1200° C. Under these conditions, the SiC film has a polycrystalline structure, and its internal stress is $3 \times 10^8$ dyn/cm$^2$. Next, another SiC film is formed in the same way on the reverse surface of the Si substrate. In this case, the SiC film formed on the reverse surface of the substrate is used as the X-ray transmitting film. X-ray transmitting films, in general, are required not only to pass X-rays, but also to have excellent transmittance with respect to alignment light (visible and infrared light), and in addition, to have tensile stress so that they are self-supporting. Suitable materials so far reported to have these properties include BN, Si, and Ti, in addition to SiC.

Next, the central part of the SiC film on the reverse surface of the substrate is selectively removed, and a W film is formed on the SiC film on the front surface to act as an X-ray absorber. The properties required of this X-ray absorber are that it should have a high X-ray absorptivity coefficient at the exposure wavelength and a low internal stress, and that it should be easy to precisely process. Suitable materials so far reported to have these properties include Au, Ta, and WNx, in addition to W. It is moreover essential that the internal stress of the X-ray absorber is as low as about $1 \times 10^8$ dyn/cm$^2$, and it is formed by sputtering which permits the stress to be controlled.

Next, an SiNx film of which the internal stress has been controlled, is formed on the W film by sputtering. An electron beam resist is then coated on the SiNx film, and patterning is carried out by an electron beam so as to form the desired pattern on the resist.

Next, the SiNx film is selectively etched by dry etching using the patterned resist as a mask, and the W film is then selectively etched using the patterned resist and etched SiNx film as a mask.

Finally, the Si substrate is etched by wet etching with KOH or the like using the SiC film on the reverse surface as a mask. In this way, the X-ray mask can be produced.

In this manufacturing process, however, the most troublesome step is the formation of the X-ray absorber pattern.

X-ray absorption films capable of transferring dimensions of 0.5 μm or less described above with high precision, are required to have the following properties:

(1) They must have high density.
(2) They must be stable and without stress variation under the thermal step conducted in the fine patterning process.
(3) They must have low stress (no more than $1 \times 10^8$ dyn/cm$^2$).
(4) They must be capable of high precision processing.

All the above four criteria must be satisfied.

The following reports have been made concerning attempts to manufacture X-ray absorber patterns which satisfy these conditions.

W-Ti films can be formed in a DC magnetron sputtering device using W-Ti (1%) alloy as a sputter target in Ar+30%N$_2$ gas atmosphere. At low gas pressures, these films show a compressive stress, but thin films sputtered at gas pressures of 2 Pa or more exhibit a small value of $5 \times 10^8$ dyn/cm$^2$. The density of the thin film is however 14–16 g/cm$^3$, which is 20–30% less than that of pure tungsten (19.2 g/cm$^3$) (Yoshioka et al, SPIE Conference, Vol. 923, p.2 (1988)).

Thus, to improve the precision of the pattern, a method has been proposed whereby the stress in the X-ray absorbing material is controlled to be less than $1 \times 10^8$ dyn/cm² by varying the sputtering conditions.

Also, it has also been demonstrated that the stress can be controlled by carrying out ion implantation over the whole surface of the X-ray absorber thin film. It is reported that if for example Si ions are implanted in a W film obtained by sputtering a W target in argon (Ar) gas, the stress can be reduced to nearly zero (I. Plotnik et al, Microelectronic Engineering 5, p. 51 (1986)). In this method, however, Si atoms or W-Si compounds at $1 \times 10^{16}$ atoms/cm² are generated as particles during etching, and tend to cause re-sticking or soiling by dirt, etc. Further, there is no description of how the W film implanted with Si ions behaves in precision processing, so there is still much uncertainty regarding the feasibility of obtaining high accuracy.

There is also a problem concerning the thermal stability of stress with the W films containing Si. In the processing of W films, resist baking is carried out at a temperature of 150-200° C. At this temperature, there is a possibility that uncombined Si atoms which have been implanted in the W may form linkages and it is thought to be unlikely that the W film can remain stable with low stress during the heating process.

In another report, tungsten nitride (WNx) is used as absorber material, this being formed by sputtering in a mixture of argon gas and nitrogen gas, and N+ ions are implanted in the WNx to control stress (Journal of Vacuum Science Technology, B6(1), 174, 1988). Various attempts were made to reduce the stress of the X-ray absorber below $1 \times 10^8$ dyn/cm². However, the density of the WNx film is very low. It is therefore necessary to make the film thick if it is to provide an effective screen for X-rays as an X-ray absorber, and consequently, it is difficult to form a fine pattern therein. Moreover, to control the stress not more than $1 \times 10^8$ dyn/cm², the substrate temperature must be controlled to 300° C.±7° C. during ion implantation.

Further, even if a thin film pattern could be formed with stress control, the fact that metals such as tungsten or metal alloys were used for the X-ray absorber meant that on exposure to the atmosphere, oxidation or gas adsorption occurred and inevitably caused stress variations.

There is, for example, the following report concerning the stability of thin films formed by sputtering of a W-Ti target in Ar+30%N₂ gas. After storage in the atmosphere for 2 months, the stress shifted in the direction of compressive stress by $1 \times 10^9$ dyn/cm², and after annealing in a N₂ atmosphere at 200° C. for 1 hour, there was a large shift of as much as $2 \times 10^9$ dyn/cm² in the direction of tensile stress.

In other words, there was a time-dependent variation of the stress in the X-ray absorber material, and the precision of the pattern of the absorber could not be maintained.

To protect the X-ray absorber pattern from oxidation or gas adsorption and to give some mechanical protection, a structure has been proposed wherein the X-ray absorber pattern is covered by a protecting film (International Electronics Meeting; 42, 1982).

In this method, however, not only the stress in the X-ray absorber film but also the stress in the protecting film had to be controlled, and it was therefore not suitable in practice.

In conventional X-ray exposure masks, therefore, it was extremely difficult to obtain an X-ray absorber film which fully satisfied the functions or properties of an X-ray absorber material (high density, low stress, stress stability and ability to be precision machined).

SUMMARY OF THE INVENTION

It is therefore an object of this invention to provide a method of manufacturing an X-ray mask wherein an X-ray absorber film is obtained which has high density and stable stress, and which can be precision processed.

A further object of this invention is to provide a device whereby the internal stress of a thin X-ray absorber film can be controlled to a desired value.

In one aspect of this invention, the above object is attained according to the invention by the ion implantation in the X-ray absorber thin film of at least one inert element having an atomic number greater than that of neon to reduce the internal stress of the thin film.

More specifically, in the process of this invention wherein an X-ray mask is manufactured by forming an X-ray transmitting film on a mask support, forming an X-ray absorber thin film on the transmitting film and then patterning the X-ray absorbing film, at least one inert element having an atomic number greater than neon, e.g., argon (Ar), krypton (Kr) and/or xenon (Xe) is ion-implanted in the X-ray absorber film before patterning thereof to reduce its internal stress.

Further, in this invention, gaps in the pattern surface can be filled by ion-implanting an inert gas element or the same element as that constituting the X-ray absorber at an angle to the film, thereby minimizing the stress of the X-ray absorber pattern and stabilizing the pattern.

Further, in this invention, when the X-ray absorber thin film is patterned, a reactive gas can be mixed with the etching gas so as to form a gas or vapor infiltration-preventing film on the etching surface, thereby stabilizing the pattern.

The gas infiltration-preventing film can also be formed by exposing the surface of the X-ray absorber pattern to a plasma atmosphere to effect a plasma doping on the pattern.

Further, in the ion implantation step of this invention, the X-ray absorbing film can be given a compressive stress of $2 \times 10^8$ dyn/cm² or lees, and a procedure is followed so that the final internal stress of said X-ray absorber film after patterning is set at $1 \times 10^8$ dyn/cm² or less.

Further, in this invention, the internal stress of the X-ray absorber thin film can be controlled to the desired value by measuring this stress during ion implantation, and controlling the quantity of ions to be implanted accordingly.

Further, according to this invention, there is provided a device for controlling an internal stress of a thin film to a desired value by ion implanting impurities in the thin film formed on a substrate, comprising first means for detecting the internal stress of the thin film, and second means for controlling the quantity of implanted ions according to the internal stress which is found by the first means.

BRIEF DESCRIPTION OF THE DRAWINGS

FIG. 3 is a characteristic diagram showing the relation between the Ar pressure in sputtering and stress;

FIG. 7 is a comparison diagram showing the relation between stress and time in an X-ray absorbing pattern of an X-ray exposure mask according to the first embodiment of this invention, and as in the prior art;

BRIEF DESCRIPTION OF THE PREFERRED EMBODIMENTS

Figure 1A:
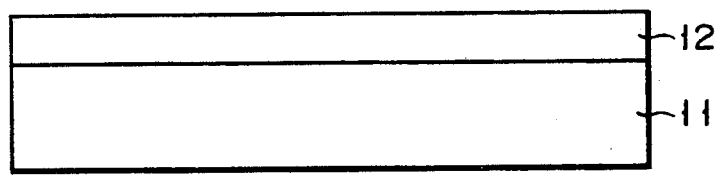
FIGS. 1A to 1E are sectional views for illustrating the method manufacturing an X-ray mask according to a first embodiment of this invention.

As mentioned previously, the method of this invention includes forming an X-ray transmitting thin film on a mask support or substrate, forming an X-ray absorber thin film on the X-ray transmitting thin film, and patterning the X-ray absorber thin film. The mask support can be provided by a Si substrate. The X-ray transmitting thin film can be formed from, for example, SiC, silicon nitride (SiNx including $Si_3N_4$), BN, Si doped with boron. Further, X-ray absorber thin film can be formed from W, Ta, Mo, a compound thereof such as a nitride (WNx, TaNx, MoNx) or a carbide (WCx, TaCx, MoCx), or an alloy such as WSix. Among these, a W thin film is most preferred which has a tensile stress and a high density. The X-ray transmitting and absorber thin films can be formed by, for example, sputtering technique. The X-ray transmitting thin film is usually formed to have a thickness of 0.5 to 2.5 $\mu$m with 2.0 $\mu$m being most preferred, while the x-ray absorber thin film is usually formed to have a thickness of 0.3 to 1.0 $\mu$m.

In a first embodiment of the invention, after the x-ray absorber thin film is formed, it is ion-implanted with at least one inert element (Group 0 element) having a atomic number greater than neon, usually, argon (Ar), krypton (Kr) and/or xenon (Xe), before the patterning thereof. The ions can be implanted substantially normal to the major surface of the X-ray absorber thin film in the first embodiment.

In a second embodiment, after the X-ray absorber thin film is patterned, the patterned X-ray absorber is ion-implanted obliquely thereto with the inert gas element or the same element as the element constituting the X-ray absorber, while rotating the substrate, to render the top surface and side wall surface portions thereof amorphous. The amorhized portions is ready oxidized internally in air outside the ion implantation chamber to form oxides of the elements constituting the X-ray absorber, which fill the gaps between the crystal grains, forming a gas invasion or infiltration-preventing film. As a result, the obtained X-ray absorber pattern can prevents gases such as oxygen and water vapor from invading or infiltrate thereinto, and thus has a structural stability, being little subject to changes with time. The oblique or slant ion implantation can be effected such that the ions are incident upon the pattern top surface at an angle of up to 30° with respect to the direction normal to the plane including the top surface.

In the first and second embodiments, the depth of the ion implantation can usually be 0.01 to 0.3 $\mu$m (micrometer).

The gas infiltration-preventing film ca be formed by plasma-doping the patterned X-ray absorber, or by performing the etching of the X-ray absorber thin film using an etching gas containing a reactive gas capable of reaction with the absorber. The gas infiltration-preventing film has a thickness of, usually, 0.01 to 0.3 $\mu$m.

In the first embodiment, when the ion implantation with the inert element is performed such that the resulting X-ray absorber thin film has a compressive stress of $2 \times 10^8$ dyn/cm$^2$ or less, the internal stress of the X-ray absorber pattern can be set at a desired value of $1 \times 10^8$ dyn/cm$^2$ or less after a thermal treatment step (usually conducted at a temperature of 100 to 200° C. for 0.5 to 1.0 hour).

The thermal treatment step mentioned above conducted on the ion-implanted X-ray absorber thin film can for example be a heat treatment in a $N_2$, Ar, or vacuum, but a $N_2$ atmosphere is to be preferred. Further, the preferred form of heat treatment is a single layer resist or multi-layer resist baking process whereby an etching mask for precision patterning the W film can be obtained.

According to this invention, after forming an X-ray absorber thin film of W or other suitable material, the internal stress of the film is reduced by implanting ions of inert gas elements of atomic number higher than that of neon, such as Ar, Kr or Xe. By ion-implanting Ar, Kr or Xe in the film, the internal stress can be reduced without changing the properties of the X-ray absorber film (such as X-ray screening ability or precision processability). Further, even after the heat treatment which is part of the process used to form a pattern on the ion-implanted X-ray absorber film (resist baking or reactive etching), the stress in the film remains stable, and a pattern with high dimensional and positional precision can thus be obtained.

According to the method of this invention, ion implantation is carried out at an angle to the X-ray absorber film or the pattern of the film. This has the effect of filling the spaces or gaps between crystal grain interfaces and preventing infiltration of vapors. In this way, the stress is reduced to the absolute minimum, and the pattern is stabilized.

Further, when the X-ray absorber film is patterned in this invention, a reactive gas can be mixed with the etching gas so as to form a film on the etching surface which prevents infiltration of vapors. This film extends to a very shallow depth on the pattern surface, and its internal stress is also suppressed to the absolute minimum to stabilize the pattern.

Further, according to this invention, the surface of the X-ray absorber pattern can be exposed to a plasma atmosphere to carry out plasma doping. A film is thereby formed to a very shallow depth on the pattern surface which prevents infiltration of vapors As in the previous cases, its internal stress is suppressed to the absolute minimum to stabilize the pattern.

Further, according to this invention, the stress in the ion-implanted thin film does not substantially undergo any time-dependent changes, and so it functions as a stable X-ray absorber mask over long periods of time.

Further, when Ar, Xe or Kr are ion-implanted in the X-ray absorber film, the internal stress of the film can be controlled. This can be done by controlling the quantity of implanted ions with automatic measurements, and an absorbing film with the desired internal stress can thus be obtained with high precision and good reproducibility.

Further, the internal stress of the X-ray absorber film may also be measured before the pattern-forming process, and the stress reduced by implanting the film with ions of at least one inert gas element of an atomic number larger than that of neon, the quantity of implanted ions being controlled depending on the internal stress which is measured. An X-ray absorber film can thus be obtained wherein the stress is controlled to a desired value.

This invention will now be described in more detail with reference to the drawings.

FIGS. 1A to 1E are sectional views showing the manufacturing process of the X-ray mask according to the first embodiment of this invention.

Firstly, a 3" Si substrate with the crystal plane orientation (111) was placed on a graphite susceptor coated with SiC in a high frequency heating type LPCVD apparatus. Vapor phase etching was then performed at 1100° C. using HCl gas so as to eliminate the natural oxide film on the Si substrate, and eliminate heavy metal impurities. This completed the surface cleaning of the Si substrate.

Next, as shown in FIG. 1A, trichlorosilane ($SiHCl_3$) gas as a source of silicon, propane ($C_3H_8$) gas as a source of C, and hydrogen ($H_2$) gas as carrier, were supplied at a substrate temperature of 1100° C., and a SiC film 12 of thickness 2 μm was thereby formed on the Si substrate 11.

In this process, the relative flowrates and pressures of the different gases were varied to control the internal stress of SiC film 12. The internal pressure of SiC film 12 varies according to the mixing proportion of the reaction gases, $SiHCl_3$ and $C_3H_8$, and on the gas pressure. Further, the gas pressure also varies according to the carrier gas flowrate. In this embodiment, a SiC film 12 was built up by adjusting the flowrates to $C_3H_8=200$ cc/min, $SiHCl_3=3$ l/min and $H_2=7$ l/min, the gas pressure being 200 Pa and the substrate temperature being 1100° C. This SiC film 12 showed a tensile stress of $3\times10^9$ dyn/cm². Further, when the crystalline properties of SiC film 12 were examined, a monocrystalline β-SiC structure was found.

Figure 1B:
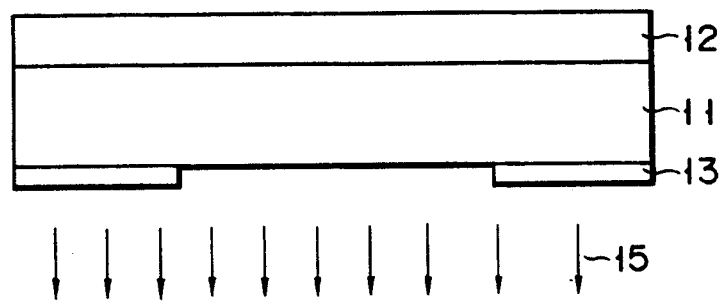

Next, as shown in FIG. 1B, a SiC film 13 was formed to a thickness of 0.5 μm under the same conditions as the above on the reverse side of Si substrate 11.

Figure 1C:
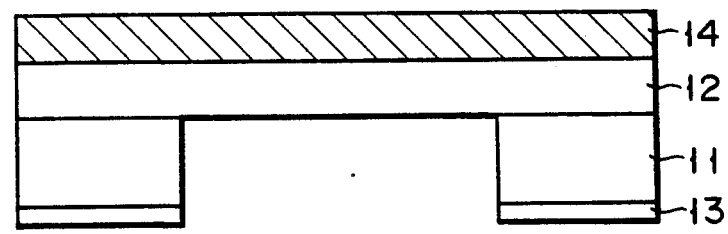
Figure 4:
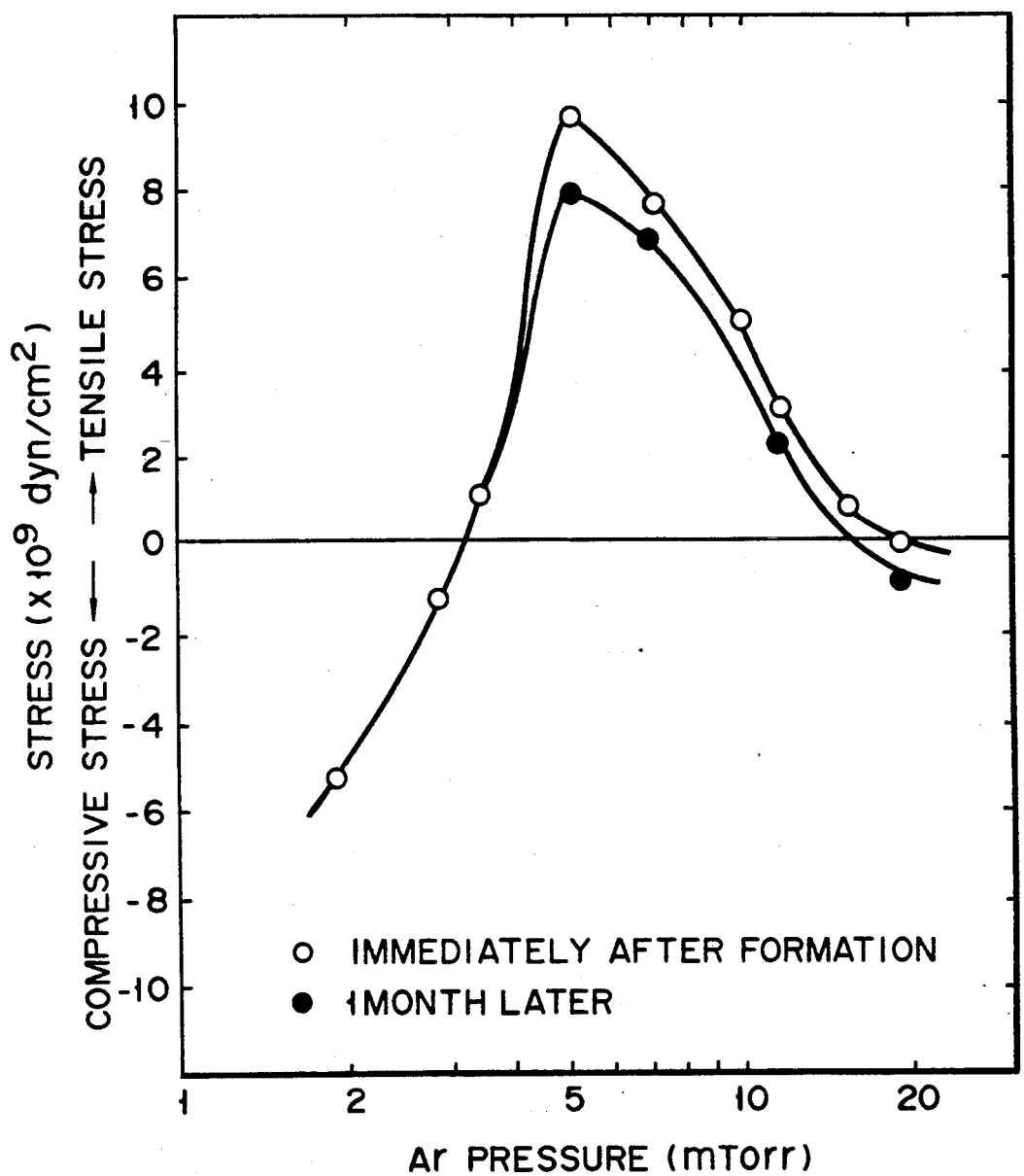
FIG. 4 is a characteristic diagram showing the time-dependent variation of the stress in a W film with respect to Ar pressure.

Next, as shown in FIG. 1C after an opening of photolithographic technique a W film 14 was formed to a thickness of 0.5 μm on SiC film 12 using a magnetron DC sputtering apparatus. The sputtering power was 1 kW, and argon gas pressure was varied in the range 2–25 m Torr. The stress in the W film formed was measured, and found to have the characteristics shown in FIG. 3. The time-dependent variation of the stress in the W film formed was measured for these different gas pressures by leaving the film in the open atmosphere for 1 month, whereon the stress was found to vary in the direction of compression as shown in FIG. 4. This variation increases for films formed at higher Ar pressure, and it was found that at Ar pressures no greater than 5 m Torr, there is less stress variation in the film formed. From this, it was established that sputtering conditions suitable for X-ray mask absorber thin films are a power of 1 kW, and an Ar gas pressure of no greater than 5 m Torr.

Figure 5:
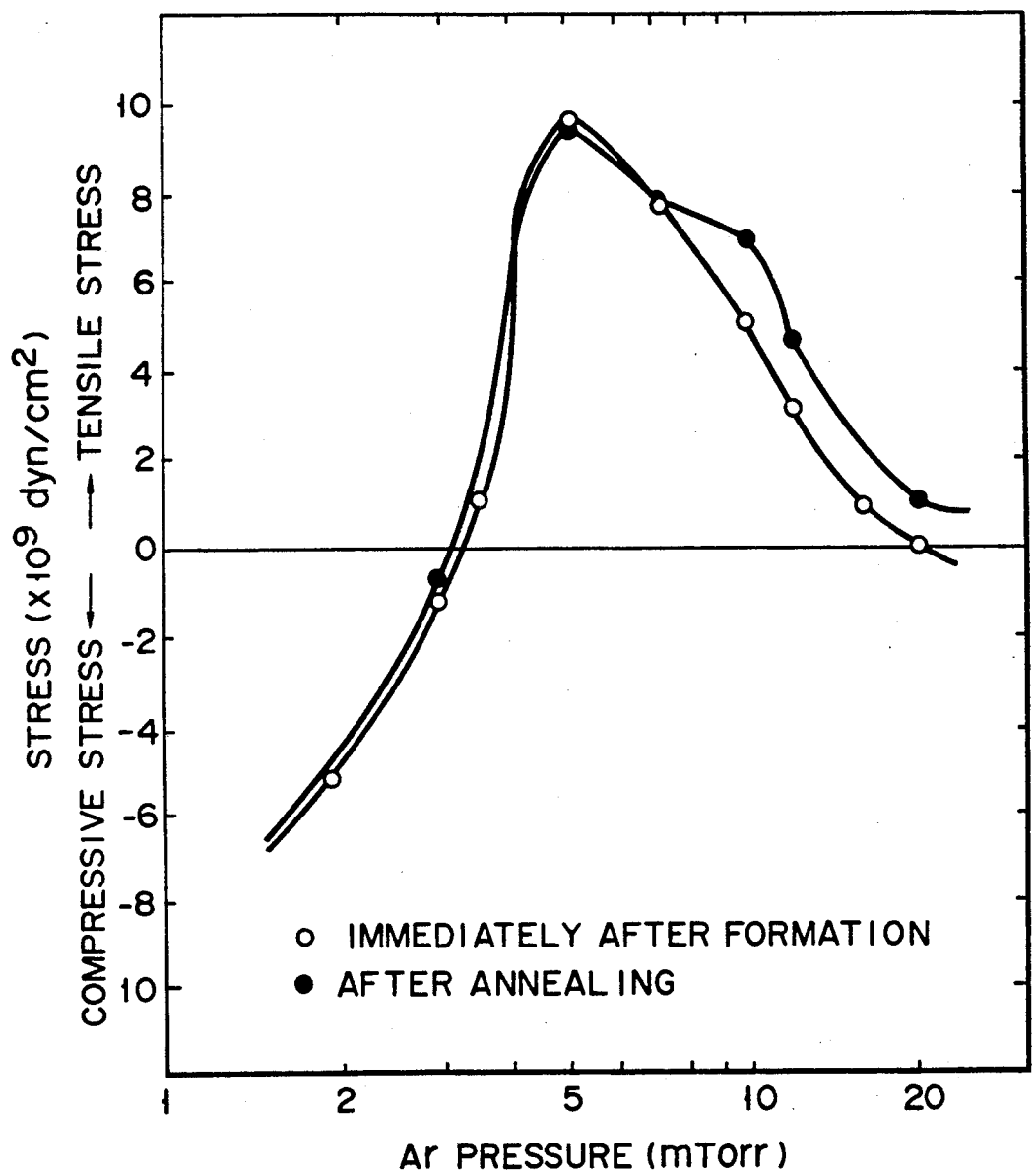
FIG. 5 is a characteristic diagram showing the change before and after annealing of a W film with respect to Ar pressure.

FIG. 5 shows the results obtained by heating the W films formed under the conditions of FIG. 3, in an atmosphere of $N_2$ at 200° C. for 1 hour. For all films, the stress varied towards the tensile side, and the stress variation was found to be large for films formed at high Ar pressures.

To obtain an X-ray absorber film which has a small time-dependent variation when used as an X-ray mask, and which has a stable stress in the heating process during patterning, it is thus evident from FIG. 4 and FIG. 5 that the film must be formed in the low Ar pressure region. These stress variations however depend not only on the Ar gas pressure during sputtering but also on the power used. Experiments were carried out under various sputtering conditions to see whether a W film could be obtained which showed no time-dependent variation and which was stable to heat. It was then found that if the W film had a high density (no less than 95% of the density of the bulk W film), the above conditions were satisfied. As the stress in these W films changes rapidly from a compressive stress to a tensile stress as shown in FIG. 3, however, it suffers a large variation for a small change in Ar gas pressure, and it was therefore found to be extremely difficult to obtain a stress of no greater than $1\times10^8$ dyn/cm² satisfactory for an X-ray absorber film with good reproducibility.

Figure 2:
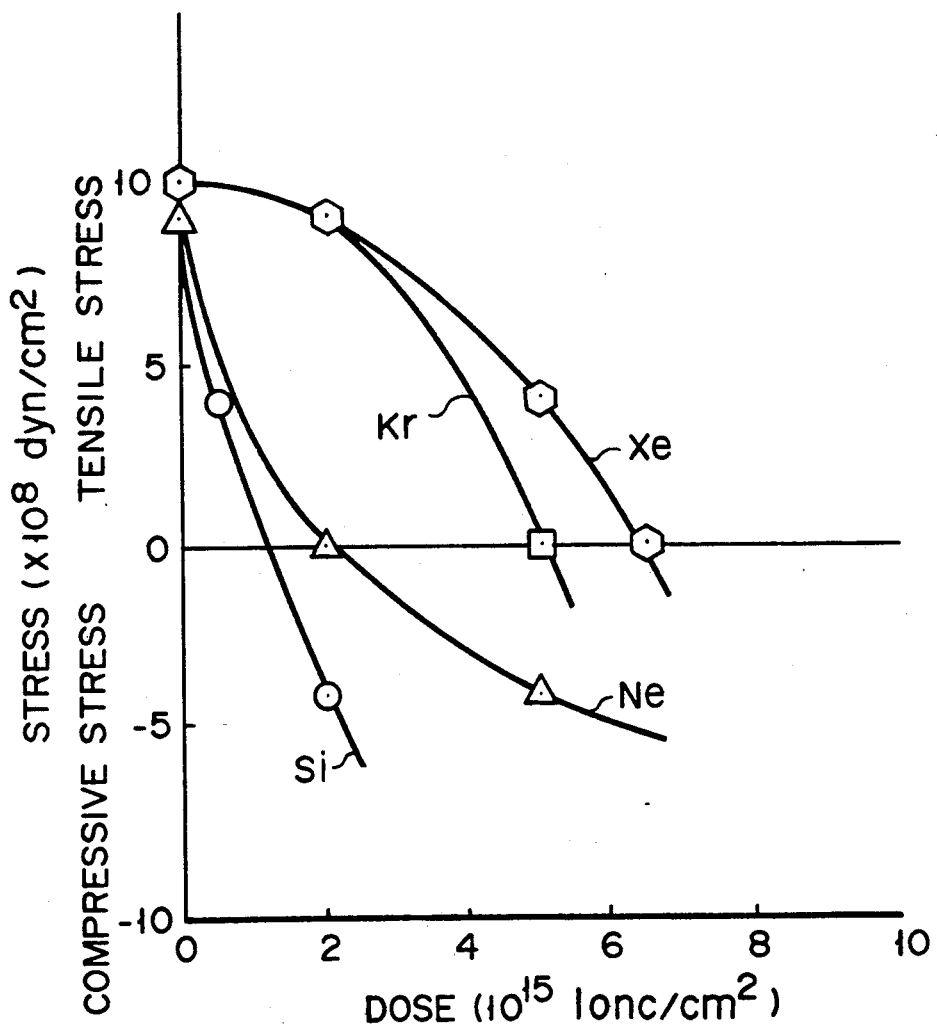
FIG. 2 is a characteristic diagram showing the relation between ion implantation dosage and stress.

Various other experiments were carried out to reduce this stress, and it was then found that if Ne, Si, Kr or Xe were ion-implanted into the W film, the stress could be reduced. In W films formed under sputtering conditions of power 1 kW and an Ar gas pressure of 3 m Torr (tensile stress of films $9\times10^8$ dyn/cm² and density of films 18.5 g/cm² (corresponding to 95.6% of the density of bulk W film), Si was ion-implanted at an energy of 170 KeV, Ne at 100 KeV, Kr at 340 KeV and Xe at 500 KeV. As shown in FIG. 2, a stress reduction was achieved by all these types of ion. To examine the thermal stability of the stress in W films which had been ion-implanted, annealing was carried out in a $N_2$ atmosphere at 200° C. for 1 hour. It was discovered that in the case of W films implanted with Si ion, the stress varied by as much as $5\times10^8$ dyn/cm² in the direction of tensile stress, while in the case of Ne, the stress varied by as much as $4\times10^8$ dyn/cm² in the direction of tensile stress. The thermal stability of the stress was therefore poor. In the case of W films ion-implanted with Kr or Xe, on the other hand, the stress variation after annealing was no more than $1\times10^8$ dyn/cm², i.e. the stress was very stable. Further, the time-dependence of stress was measured. It was found that in the case of W films ion-implanted with Si, the stress after 1 month varied by $2\times10^8$ dyn/cm² in the direction of compressive stress, while with W films ion-implanted with Ne, there was a stress variation of $1\times10^8$ dyn/cm². On the other hand, W films ion-implanted with Kr or Xe showed absolutely no time variation. As shown in FIG. 1C, therefore, to obtain the X-ray absorbing film, a W film 14 of density 18.5 g/cm² was formed by sputtering at an Ar gas pressure of 3 m Torr and a power of 1 kW, and Kr ion implantation 15 was carried out on W film 14 using an accelerating voltage of 340 KeV and a dosage of $5\times10^{15}$ atms/cm². In this way, the stress of the W film before ion implantation, which was a tensile stress of $8 \times 10^8$ dyn/cm$^2$, was changed by ion implantation 15 to a compressive stress with the low value of $4 \times 10^7$ dyn/cm$^2$. Subsequently, etching was carried out by a mixed solution of HF/HNO$_3$ on the reverse side of Si substrate 11 using the remaining SiC film 13 as a mask.

Figure 1D:
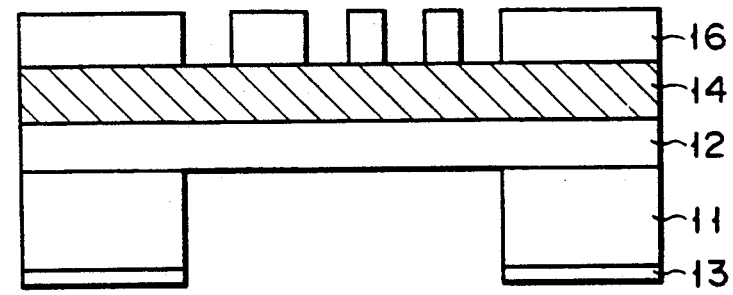
Figure 1E:
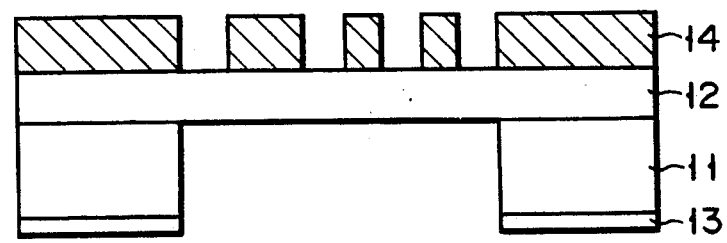

Next, as shown in FIG. 1D, CMS (chloromethylated polystyrene) was coated on W film 14 to a thickness of 0.6 μm as an electron beam resist 16. After eliminating the solvent from resist 16 by baking in a N$_2$ atmosphere at 150° C., the desired pattern (minimum line width 0.2 μm) was formed on resist 16 by means of electron beam lithography using a variable shape beam of accelerating voltage of 50 KeV, and at a dosage of 150 μC/cm$^2$.

Next, as shown in FIG. 1 E, with resist patter 16 used as a mask W film 14 were subjected to ECR type plasma etching using SF$_6$+10% O$_2$, a gas pressure of $5 \times 10^{-3}$ Torr, and a microwave power of 200 W, and patterned by anisotropic etching. The X-ray mask formed by the above process was then evaluated by determining the positional error in the surface pattern on the mask. This was done by measuring the discrepancy between a specific resist pattern formed in a $10 \times 10$ mm$^2$ area of the mask by an electron beam, and the pattern on the W film after patterning. A value of 0.02 μm (3σ) was found, which is sufficiently small.

In experiments, the present inventors confirmed that by exposing and developing a PMMA (polymethyl methacrylate) resist of thickness 1 μm through said mask using SOR light, an ultra-fine pattern of 0.2 μm was formed. Further, in endurance tests of the X-ray mask using long-term irradiation with SOR light, no deterioration or damage due to SOR light was observed at an irradiation dosage of 20 Mj/cm$^3$.

It is important to note here that although it is possible to reduce the stress in the W film by ion implantation, the stress varies in the direction of tension in subsequent processing albeit slightly. In further experiments, a W film of no less than density 16.3 g/cm$^3$ was implanted with Kr or Xe ions, coated with an electron beam resist for patterning the film, and then baked in a N$_2$ atmosphere (e.g. at 150°). It was found that in the case of all these ions, the stress shifted towards the tensile side by $1 \times 10^8$ dyn/cm$^2$. For this reason, if the compressive stress after introducing Kr or Xe ions is $2 \times 10^8$ dyn/cm$^2$, the final internal stress (compressive stress) will be $1 \times 10^8$ dyn/cm$^2$; while if the compressive stress after introducing Kr or Xe ions is 0, the final internal stress (tensile stress) will be $1 \times 10^8$ dyn/cm$^2$.

If therefore the stress in the W film is controlled such that it is a compressive stress with an absolute value of no more than $2 \times 10^8$ dyn/cm$^2$, the final internal stress (compressive or tensile) will have a very small value of no more than $1 \times 10^8$ dyn/cm$^2$. It is thus effective to carry out ion implantation in anticipation of the stress arising in subsequent processes (tensile direction), and form a W film in which the stress will finally have a small absolute value.

Apart from Kr and Xe ions, Ar ion may also be effectively used.

EXAMPLE 2

The second embodiment of this invention will now be described in detail with reference to the drawings.

FIG. 6A to FIG. 6G are sectional views which show the manufacturing process of the X-ray exposure mask in the 2nd embodiment of this invention.

This process is characterized by the fact that krypton (Kr) ion is implanted into the W film used as X-ray absorber, and the surface layer is converted to an amorphous state without hardly any change in stress.

Figure 6A:
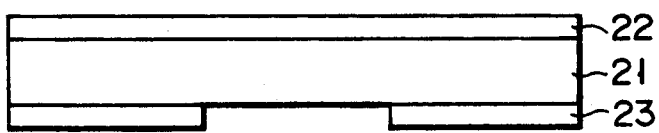
FIGS. 6A to 6G are sectional views illustrating the manufacturing process of an X-ray exposure mask according to a second embodiment of this invention.
Figure 6B:
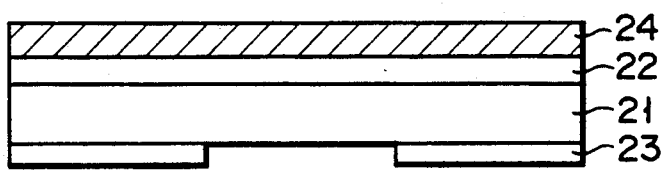
Figure 6C:
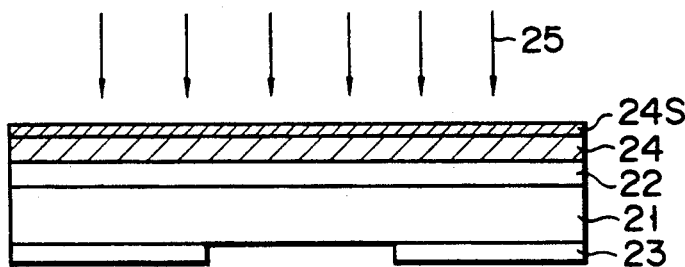
Figure 6D:
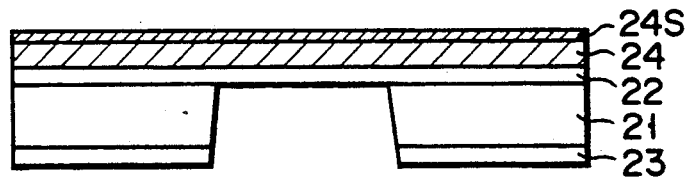
Figure 6E:
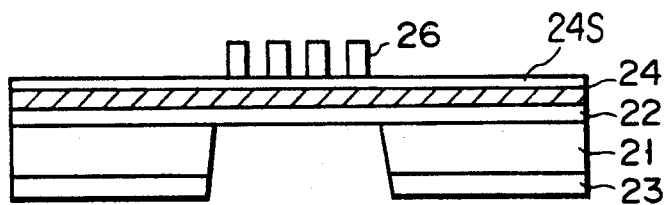
Figure 6F:
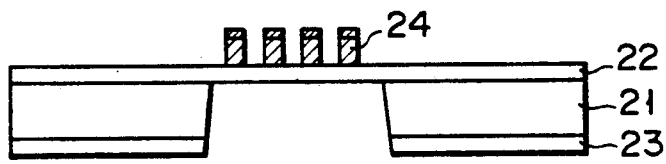
Figure 6G:
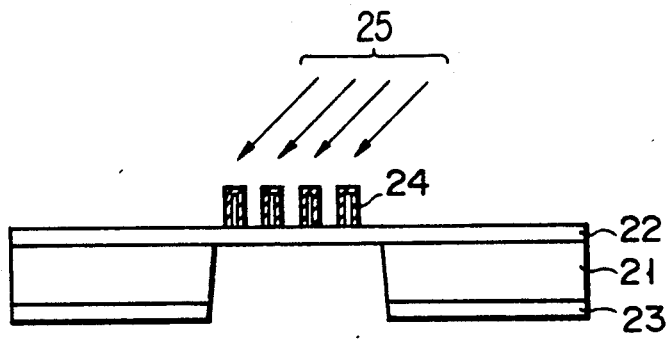

As shown in FIG. 6G, this X-ray exposure mask comprises a silicon substrate 21, X-ray transmitting films 22 and 23 consisting of silicon carbide of thickness 1 μm formed on the surface and part of the reverse side of this substrate, and an X-ray absorber pattern 24 of which the surface has been rendered amorphous formed on X-ray transmitting film 22. This X-ray exposure mask, moreover, is used to transfer a pattern by irradiating a silicon wafer with SOR light through the mask from the opposite side of said silicon substrate, the wafer consisting of a coating of PMMA or similar resist on the pattern-forming surface of the X-ray absorbing film of this silicon substrate 1.

This X-ray mask can be formed as follows.

Firstly, a 3″ Si substrate with the crystal plane orientation (111) was placed on a graphite susceptor coated with SiC in a high frequency heating type LPCVD apparatus. Vapor phase etching was then performed at 1100° C. using HCl gas so as to eliminate the natural oxide film on the Si substrate, and eliminate heavy metal impurities. Next, trichlorosilane (SiHCl$_3$) gas and propane (C$_3$H$_8$) gas as reaction gases, and hydrogen (H$_2$) gas as carrier, were supplied at a substrate temperature of 1100° C., and a SiC film 22 of thickness 2 μm was thereby formed on the Si substrate 11.

Next, a SiC film 23 was built up to a thickness of 0.5 μm under the same conditions as the above on the reverse side of Si substrate 21, and an opening of 20 mm diameter was formed in SiC film 23 by the conventional photolithographic technique (FIG. 6A).

Next, as shown in FIG. 6B, a tungsten film 24 was built up to a thickness of 0.5 μm on SiC film 22 using a magnetron DC sputtering apparatus. The sputtering power was 1 kW, and Ar gas pressure was set on the low pressure side to form a W film of high density, at 3 Torr such that the stress in the film can be zero. The stress in the tungsten film so formed was $2 \times 10^8$ dyn/cm$^2$. Next, as shown on FIG. 6C, krypton 25 was ion-implanted in tungsten film 24 at an energy of 180 KeV such that the dosage was $2 \times 10^{15}$ atoms/cm$^2$, so as to form a protective layer 24S to prevent infiltration of vapor in the surface of film. As the peak in the concentration distribution of Kr in the W film is at 250 Å very near the surface, it is thus possible to convert the surface layer to an amorphous state without causing any variation of the stress. On the contrary, if it is desired to change the stress by ion implantation, the position of the concentration peak may be set at a greater depth.

Following this, as shown in FIG. 6D, the reverse side of substrate 21 is etched with a mixture of HF/HNO$_3$ using the remaining SiC layer 23 as a mask.

Then, as shown in FIG. 6E, CMS (chloromethylated polystyrene) of film thickness 0.6 μm was coated on W film 24 as a electron beam resist 26, and after baking in a N$_2$ atmosphere at 150° C. to eliminate solvent from resist 26, the resist was exposed and the desired pattern formed by an electron beam patterning apparatus.

Electron beam resist 26 patterned as described was then used as a mask for reactive ion etching using an ECR type plasma etching apparatus, SF$_6$+10% O$_2$ as the etching gas, a gas pressure of 5 m Torr, and a microwave power of 200 W. Said tungsten film 24 was thus patterned, as shown in FIG. 6F, to form a superfine X-ray absorber line and space pattern with a line width of 0.2 μm.

Subsequently, as shown in FIG. 6G, the X-ray mask was rotated at a speed of 1 rpm, and Kr 25 was ion-implanted at an angle in the lateral wall of the W film pattern 24 at an incidence angle of 7° and an energy of 180 KeV such that the dosage was $2 \times 10^{15}$ atoms/cm$^2$. This was done to form a protective layer in the lateral wall of the X-ray absorber pattern so as to prevent infiltration of vapor. In this process, Kr ions are ion-implanted in the surface as well as in the lateral wall of the pattern, and the process described in FIG. 6C above is therefore not absolutely necessary.

The positional discrepancy of the pattern in the X-ray mask thus formed was then determined for a specific pattern in a 20×20 mm area of the mask. This was done by measuring the discrepancy between the resist pattern formed by the electron beam and the tungsten film after patterning using a wavelength type measuring apparatus. A value of 0.02 μm (3σ) was found, which is sufficiently small.

Further, using this X-ray exposure mask, a silicon wafer coated with a resist of film thickness 1 μm (PMMA) was exposed at a distance of 30 μm by SOR light. A line and space PMMA resist pattern of line width 0.2 μm was thereby formed with good contrast and high positional accuracy. Further, a test was also carried out to determine the endurance of the X-ray mask in long-term irradiation by SOR light. It was found that for an irradiation of 20 MJ/cm$^2$, there was no deterioration or damage due to the SOR light.

The X-ray exposure mask in this embodiment of the invention is thus extremely accurate and stable.

In FIG. 7, the curve a shows the relation between the stress in this X-ray absorber pattern and the time elapsed after the pattern was formed. As can be seen from the curve, there is practically no change with time. For comparison, curve b shows the relation between stress and time elapsed in the case of an X-ray absorbing pattern formed on a tungsten film where ion implantation was not carried out. From these comparisons, it may be seen that the X-ray exposure mask in this embodiment of the invention is extremely stable.

This is thought to be due to the fact that as the W film formed by sputtering consists of columnar crystal grains, gradual gas adsorption or oxidation occurs via the gaps at crystal grain interfaces, and this causes a stress variation in the direction of compressive stress in W films which have not been ion-implanted.

In W films wherein the surface has been rendered amorphous, on the other hand, there are no gaps at crystal particle interfaces, and they therefore have a stable stress.

Further, in the above example, ion implantation was carried out both before and after patterning, but it may be performed either before or after patterning.

EXAMPLE 3

A third embodiment of this invention will now be described below.

In this embodiment, by mixing a desired gas with the etching gases, a film to prevent infiltration of gas or vapor is also formed in the lateral wall.

Figure 8A:
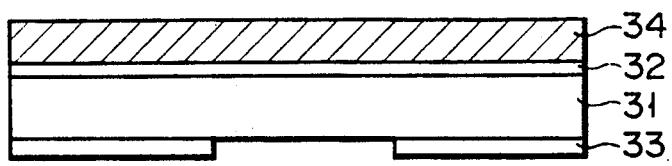
FIGS. 8A to 8E are sectional views illustrating the manufacturing process of an X-ray exposure mask according to a third embodiment of this invention.

Firstly, as shown in FIG. 8A and as in the case Example 1, SiC films 32 and 33 were built up on the front and reverse sides of silicon substrate 31, an aperture was formed in SiC film 33 by the conventional photolithographic technique, and a W film 34 was then formed on the surface of SiC film 33 on the front side of the substrate.

Figure 8B:
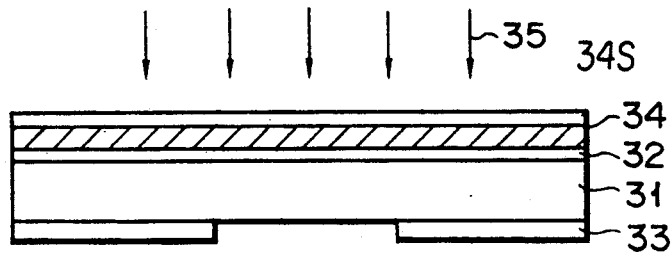

Next, as shown in FIG. 8B, krypton 35 was ion-implanted in the surface of tungsten film 34 as in Example 1 using an energy of 180 KeV such that the dosage was $2 \times 10^{15}$ atoms/cm$^2$, so as to form a protective film 34S to prevent infiltration of vapor in the surface.

Figure 8C:
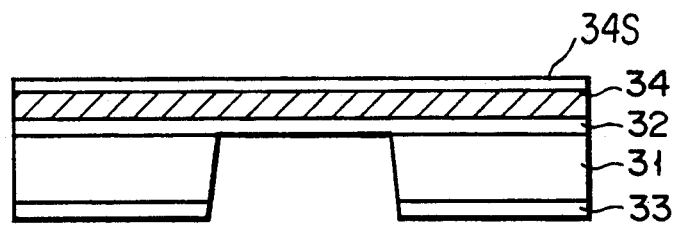
Figure 8D:
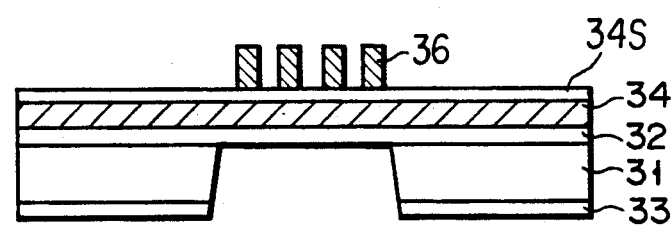

Subsequently, as shown in FIG. 8C, the reverse side of silicon substrate 31 was etched by a mixture of HF/HNO$_3$ using the remaining SiC film 33 as a mask. Next, as shown in FIG. 8D, CMS of film thickness 0.6 μm was coated on W film 34 as an electron beam resist 36, and after baking in a N$_2$ atmosphere at 150° C. to eliminate solvent from the resist, the resist was exposed and the desired pattern formed by an electron beam patterning apparatus.

Figure 8E:
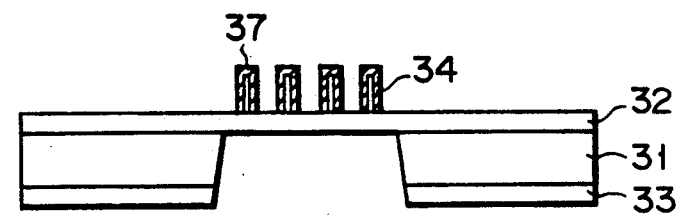

Electron beam resist 36 patterned as described was then used as a mask for reactive ion etching using an ECR type plasma etching apparatus, SF$_6$+10% O$_2$+10% C$_2$H$_4$ as the etching gas, a gas pressure of 5 mTorr, and a microwave power of 200 W. Said tungsten film 34 was thus patterned, as shown in FIG. 8E, to form a superfine X-ray absorbing line and space pattern with a line width of 0.2 μm. In this process the carbon compound mixed with the etching gas forms a protective film 37 on the top and lateral wall of W film 34 to prevent infiltration of vapor, this film having carbon as its principal component.

The positional discrepancy of the pattern in the X-ray mask thus formed was then determined for a specific pattern in a 20×20 mm area of the mask. This was done by measuring the discrepancy between the resist pattern formed by the electron beam and the tungsten film after patterning using a wavelength type measuring apparatus. A value of 0.01 μm (3σ) was found, which is sufficiently small.

A comparison was also made, using said wavelength type measuring apparatus, of the position of the pattern on this X-ray exposure mask after leaving in the atmosphere for 6 months, and the position of the pattern immediately after manufacture. No shift in position was detected.

The X-ray exposure mask of the 3rd embodiment of this invention is thus extremely precise and stable.

In this example, the film formed on the W film during etching is not limited to substances having carbon as their principal component, and any film which prevents infiltration of vapor or gas (e.g., oxygen gas, (H$_2$O gas), such as tungsten nitrides or SiO$_2$ may also be used. Apart from ethylene, therefore, the gas mixed with the etching gases may be the other hydrocarbon gases such as C$_2$H$_2$, CH$_4$ and/or CHCl$_3$, or nitrogen, for example.

EXAMPLE 4

A fourth embodiment of this invention will be described below.

According to this method, after patterning the X-ray absorber film Kr plasma doping is also carried out to form a protective film preventing infiltration of vapor in the lateral wall of the pattern.

As shown in FIG. 9A to FIG. 9D, in a similar way to the process of Example 3 which was illustrated in FIG. 8A to FIG. 8D, SiC films 42 and 43 were formed on the front side and the reverse side of silicon substrate 41. An aperture was formed in the center part of SiC film 43 by the usual lithographic technique, and a W film 44 was built up on the surface of SiC film 43 on the front side of the substrate. Krypton ions were implanted in W film 44 so as to form a protective layer 44S to prevent infiltration of vapor, and etching was then carried out on the reverse side of silicon substrate 41 in the same way using the remaining SiC film 43 on the reverse side as a mask. Finally, a pattern of an electron beam resist 46 was formed on W film 44.

Figure 9A:
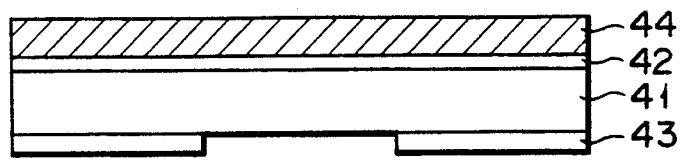
FIGS. 9A to 9F are sectional views illustrating the manufacturing process of an X-ray exposure mask according to a fourth embodiment of this invention.
Figure 9B:
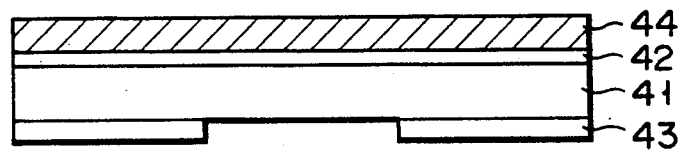
Figure 9C:
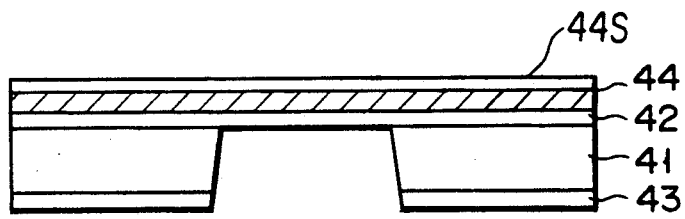
Figure 9D:
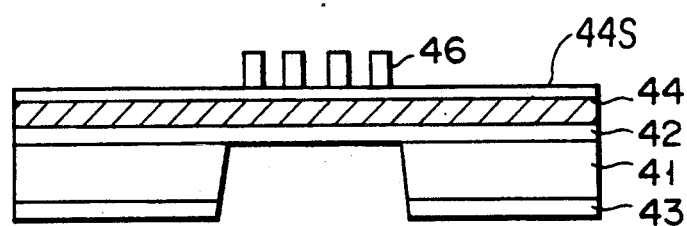
Figure 9E:
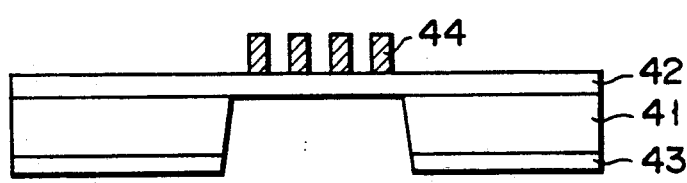

Electron beam resist 46 patterned as described was then used as a mask for reactive ion etching using an ECR type plasma etching apparatus, $SF_6 + 10\% O_2$ as the etching gas, a gas pressure of 5 mTorr, and a microwave power of 200 W. Said tungsten film 44 was thus patterned, as shown in FIG. 9E, to form a superfine X-ray absorbing line and space pattern with a line width of 0.2 μm.

Figure 9F:
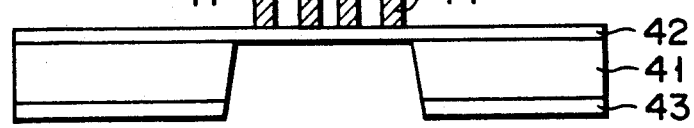

Subsequently, as shown in FIG. 9F, Kr plasma doping was carried out on W pattern 43 using the microwave ECR method, and a protective film to prevent infiltration of vapor 47 was thus formed on the surface of W pattern 43. The gas introduced here was 100% Kr gas, the degree of vacuum was 0.5 mm Torr, the ECR accelerating voltage was 500 V, and doping was carried out for 100 sec.

As in the previous examples, the positional discrepancy of the pattern in the X-ray mask thus formed was then determined for a specific pattern in a 20×20 mm area of the mask. This was done by measuring the discrepancy between the resist pattern formed by the electron beam and the tungsten film after patterning using a wavelength type measuring apparatus. A value of 0.02 μm (3σ) was found, which is sufficiently small.

A comparison was also made, using said wavelength type measuring apparatus, of the position of the pattern on this X-ray exposure mask after leaving in the atmosphere for 6 months, and the position of the pattern immediately after manufacture. No shift in position was detected.

The X-ray exposure mask of the 4rd embodiment of this invention is thus extremely precise and stable.

Further, in an endurance test of long-term irradiation by SOR light, very good results were obtained as in the case of Examples 1 to 3.

Here, Kr was used as the substance with which to carry out plasma doping, but the method is not limited to Kr, and any substance may be used which fills the gaps between the crystal grains of the W film surface. In this regard, other inert gas element, C, N and W or the like are also effective.

Further, in the above examples, a W film was used as the X-ray absorbing film formed on the mask substrate. The method is not however limited to W, and gold (Au), tantalum (Ta), molybdenum (Mo), or their nitrides or oxides, may also be used.

Further, in the above examples, a silicon carbide film was used as the X-ray transmitting film formed on the mask substrate. The method is however not limited to SiC, and silicon, silicon nitride, boron nitride or a boron-doped silicon substrate may also be used.

Further, a CMS single-layer resist was used in the fabrication of the W film. It is however possible to use resists such as PMMA which has a high resolution, or SAL 601 which includes a chemical amplification factor, and multi-layer resists may also be used. Further, the etching of the W film is not limited to ECR plasma etching, and magnetron type reactive ion etching may also be used. In such a case, etching properties may be improved by cooling the substrate.

EXAMPLE 5

Figure 10:
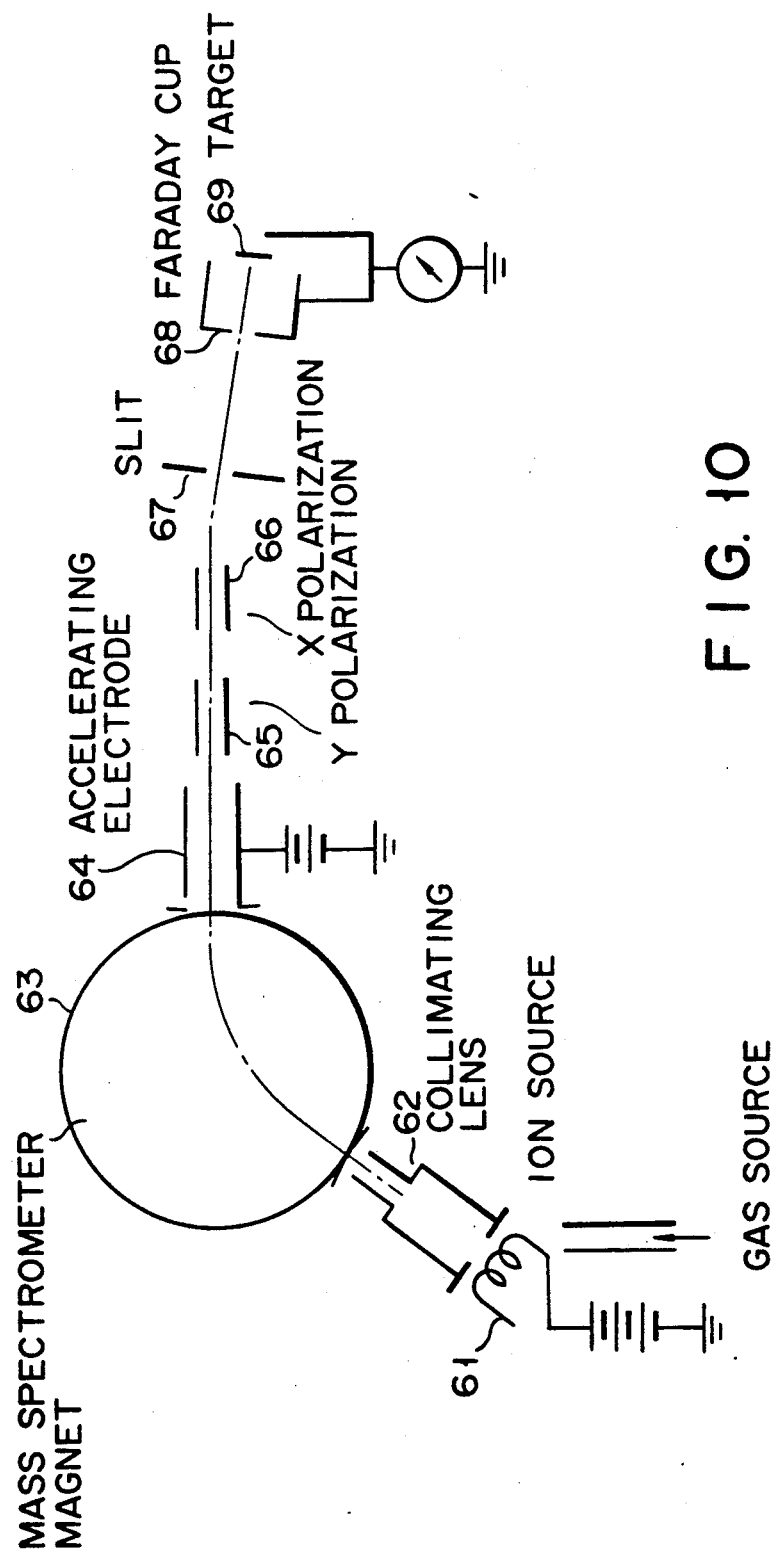
FIG. 10 is a schematic view of the ion implantation apparatus.
Figure 11:
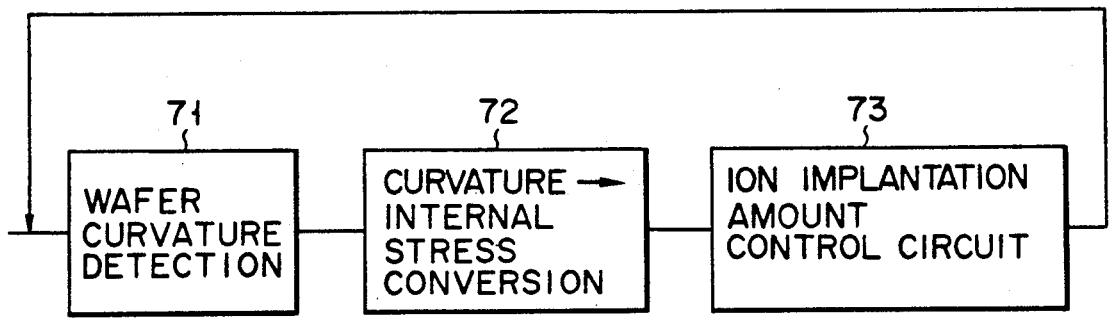
FIG. 11 is a block diagram of the control device used in the ion implantation apparatus of this invention.

FIG. 10 and FIG. 11 illustrate the manufacture of an X-ray mask by another method of this invention, and show the apparatus used to control the internal stress of the thin film. In this example, by measuring the internal stress in W film 14 when Kr or Xe ions are implanted in W film 14 as shown in FIG. 1C above, the quantity of ions implanted is controlled in order to obtain the desired internal stress.

In FIG. 1C, the stress in the W film was found to fluctuate when the W film was built up on SiC film 12 by sputtering with an Ar gas pressure of 3 mTorr and a power of 1 kW. This is due to several factors such as adhesion to the cooled substrate holder during sputtering, or the surface configuration of SiC film 12. The range of fluctuation in the stress of the W film obtained was $5 \times 10^8 - 1 \times 10^9$ dyn/cm² (tensile stress). When the Kr ion implantation dosage was varied according to the stress in these W films to reduce the stress to the desired value, a few % of the films were found not to satisfy the stress condition necessary to use them as X-ray absorbers (compressive stress of $1 \times 10^8$ dyn/cm²).

In this example, therefore, a suitable dosage of ions is implanted depending on the scatter of the initial stress so as to obtain the desired stress in the W film.

In this example, therefore, a thin film internal stress controller as shown in FIG. 11 is added to the ion implantation apparatus shown in FIG. 10. In FIG. 10, 61 is an ion source, 62 is a collimating lens, 63 is a mass spectrometer type magnet, 64 is an accelerating electrode, 65 is a Y-polarized electrode, 66 is an X-polarized electrode, 67 is a slit, 68 is a Faraday cup and 69 is a target, this structure being identical to that of the conventional ion implantation apparatus. In FIG. 11, 71 is a wafer curvature detection circuit, 72 is a curvature—stress conversion circuit which calculates the stress from the amount of curvature, and 73 is an ion implantation control circuit. This controller measures the internal stress of the W film when ions are being implanted in it, and stops ion implantation when the measured quantity reaches the desired value.

The apparatus shown in FIG. 11 is installed in the substrate holder of the ion implantation apparatus show in FIG. 10. It is thereby possible to measure the internal stress of the W film automatically and control the dosage of ion implantation such that the desired stress is obtained. For the curvature detection circuit in FIG. 11, interferometry with a He-Ne laser is used. As the curvature of the wafer is directly proportional to the internal stress of the thin film, it is possible to calculate the stress by detecting the curvature.

Figure 12:
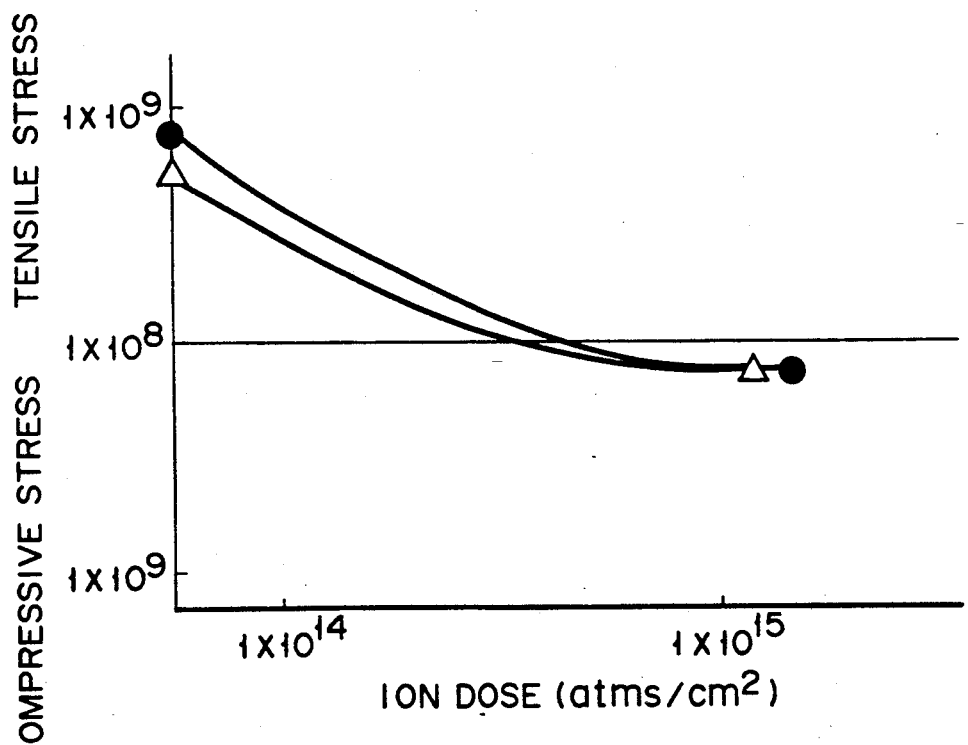
FIG. 12 is a characteristic diagram showing the relation between ion dosage and stress.

FIG. 12 shows the results of controlling the stress of the W film using the above apparatus. As shown in FIG. 12, since a suitable dosage of ions is implanted in W films with different initial stresses, the desired stress is obtained for all W films (a compressive stress of $1 \times 10^8$ dyn/cm²). It is therefore possible to manufacture a high precision X-ray mask in good yield.

This invention is not limited to the above examples. The X-ray absorbing film for example is not limited to W, and Ta, Mo or their nitrides and carbides may also be used. Further, although a SiC film was used as the X-ray transmitting film, $SiN_x$, BN or a boron-doped Si substrate can also be used. A single layer resist of CMS was used in the processing of the W film, but resists such as high resolution PMMA or SAL 601 which includes a chemical amplification factor may also be used. Multi-layer resists may also be used. When carrying out etching of the W film using these resists as etching masks, the etching method is not limited to ECR type plasma etching, and magnetron type RIE (reactive ion etching) may also be employed.

During etching of the W film, etching properties may be improved by cooling the substrate to the neighborhood of −50° C. The etching gas may be the other fluorine-containing gas such as $CF_4$, instead of $SF_6$. Further, the etching gases are not limited to fluorine-containing gases, and it is possible to use also chlorine-containing gases, a mixture of fluorine-containing and chlorine-containing gases, or a mixture of bromine-containing and chlorine-containing gases. For example, $Cl_2$, $CCl_4$, $SiCl_4$, or $BCl_3$ can be used as the chlorine-containing gas, and $Br_2$, $BBr_3$, or $HBr$ can be used as the bromine-containing gas. Further, in the examples, a W film was formed on a Si wafer and after carrying out ion implantation, the wafer was etched on the reverse side. The Si wafer may however also be etched on the reverse side after forming the pattern on the W film.

Further, in the examples, internal stress was determined from the substrate curvature using laser interferometry. To determine the internal stress in the W film it is however possible to measure the distortion of the crystal lattice using X-ray diffraction or Raman spectrometry, or use a Newton ring optical interference microscope, or single slit diffraction, or any method which can measure the curvature of the substrate with high precision. Further, conditions such as the thickness of the film in each part may be varied as desired according to specifications. Apart from this, various modifications may be envisaged within the scope and spirit of the present invention.

As we have described above according to this invention, in the manufacture of an X-ray mask consisting of an absorber film pattern on a transparent support, the surface of the pattern is ion-implanted with an inert gas or the same substance as the material of the X-ray absorber film; or in the patterning of the X-ray absorber film, reactive gases are mixed with the etching gases so as to form a film which prevents infiltration of vapors in the etching surface; or the surface of the X-ray absorber pattern is exposed to a plasma atmosphere to form a film which prevents infiltration of vapors by plasma doping. While keeping stress variations to the absolute minimum, infiltration of vapors and the pattern can be stabilized, hence a stable X-ray mask can be provided with precision over a long period of time.

This X-ray absorber film shows no time-dependent stress variation, and its stress is also stable even in the annealing and etching processes of the patterning operation.

It is thus possible to form an X-ray absorber pattern on an X-ray transmitting film wherein the absorber film has low stress, high density, thermal stability and no time-dependent variation, which was difficult to achieve in the prior art, and wherein the pattern has fine dimensional and positional precision.

What is claimed is:

1. A method of manufacturing an X-ray msk comprising the steps of:
    (a) forming an X-ray transmitting thin film on a mask support;
    (b) form an X-ray absorber thin film on said X-ray transmitting thin film;
    (c) patterning said X-ray absorbe thin film with a desired pattern to from an X-ray absorber pattern: and
    (d) ion-implanting, prior to step (c), at least one inert element with an atomic number greater than that of neon in only a surface layer of said X-ray absorber thin film.

2. The method according to claim 1, wherein the inert element is at least one gas element chosen from the group consisting of argon, krypton and xenon.

3. The method according to claim 1, further comprising step (e) of conducting oblique ion implantation on the X-ray absorber pattern after step (C).

4. The method according to claim 3, wherein an inert element with an atomic number greater than that of neon is obliquely ion-implanted.

5. The method according to claim 3, wherein an element of the same type as the component elements of the X-ray absorber is obliquely ion-implanted.

6. The method according to claim 1, wherein the patterning is carried out by reactive plasma etching using an etching gas that contains a gas reactive with said X-ray absorber, thereby forming a gas infiltration-preventing film in the surface of the said X-ray absorber pattern.

7. The method according to claim 6, wherein the reactive gas is hydrocarbon gas or nitrogen.

8. The method according to claim 1, further comprising step (f) of plasma doping the top and sides of the X-ray absorber pattern after step (c).

9. A method of manufacturing an X-ray mask comprising the steps of:
    (a) forming an X-ray absorber thin film on a transparent support;
    (b) forming an X-ray absorber pattern by patterning said X-ray absorber thin film in desired pattern; and
    (c) implanting ions in the top and sides of said pattern by oblique ion implantation to said X-ray absorber pattern.

10. The method according to claim 9, wherein at least one inert gas element chosen from the group consisting of argon, krypton and xenon is obliquely ion-implanted.

11. The method according to claim 9, wherein an element of the same type as the constituent element of said X-ray absorber is obliquely ion-implanted.

12. The method according to claim 9, wherein the patterning is carried out by reactive plasma etching using an etching gas that contains a gas reactive with said X-ray absorber, thereby forming a gas infiltration-preventing film in the surface of the said X-ray absorber pattern.

13. The method according to claim 12, wherein the reactive gas is ethylene or nitrogen.

14. The method according to claim 9, further comprising step (d) of plasma doping the top and sides of the X-ray absorber pattern after step (c).

15. A method of manufacturing an X-ray mask comprising the steps of:
    (a) forming an X-ray transmitting thin film on a mask support,
    (b) forming an X-ray absorber thin film on said X-ray transmitting thin film,
    (c) patterning said X-ray absorber thin film to form an X-ray absorber pattern,
    (d) ion implanting, prior to step (c), at least one inert gas element with an atomic number greater than that of neon in only a surface layer of said X-ray absorber thin film such that said X-ray absorber thin film has a compressive stress no greater than $2 \times 10^8$ $dyn/cm^2$, and
    (e) heat-treating said X-ray absorber after process (d) such that the internal stress of said X-ray absorber pattern is no greater than $1 \times 10^8$ $dyn/cm^2$.

16. A method of manufacturing an X-ray mask comprising the steps of:
 (a) forming an X-ray transmitting thin film on a mask support,
 (b) forming an X-ray absorber thin film on said X-ray transmitting thin film,
 (c) patterning said X-ray absorber thin film to form an X-ray absorber pattern, and
 (d) while measuring the internal stress of said X-ray absorber thin film and controlling the quantity of ions implanted according to the measured internal stress, ion-implanting at least one inert gas element with an atomic number greater than that of neon in only a surface layer of said X-ray absorber thin film to reduce the internal stress of said X-ray absorber thin film so as to control said internal stress to a desired value.

17. A method of manufacturing an X-ray mask comprising the steps of:
 (a) forming an X-ray transmitting thin film on a mask support;
 (b) forming an X-ray absorber thin film on said X-ray transmitting thin film;
 (c) patterning said X-ray absorber thin film with a desired pattern to form an X-ray absorber pattern; and
 (d) ion-implanting, prior to step (c), at least one inert element having an atomic number greater than that of neon in a surface layer of said X-ray absorber thin film, thereby forming an internal stress-alleviating layer comprising said ion-implanted surface layer, leaving a non-implanted lower layer of said absorber thin film, said stress-alleviating layer reducing the internal stress of said X-ray absorber thin film by canceling its stress with the stress of said non-implanted lower layer.

* * * * *